United States Patent [19]
Shiota et al.

[11] Patent Number: 5,879,970
[45] Date of Patent: Mar. 9, 1999

[54] PROCESS OF GROWING POLYCRYSTALLINE SILICON-GERMANIUM ALLOY HAVING LARGE SILICON CONTENT

[75] Inventors: Kunihiko Shiota, Tokyo; Jun-ichi Hanna, Yokohama, both of Japan

[73] Assignee: NEC Corporation, Tokyo, Japan

[21] Appl. No.: 922,577

[22] Filed: Sep. 3, 1997

[30] Foreign Application Priority Data

Sep. 5, 1996 [JP] Japan ................................. 8-271262

[51] Int. Cl.⁶ ..................... H01L 21/205; H01L 21/336
[52] U.S. Cl. ..................... 438/151; 438/479; 438/488; 438/935; 438/507; 438/508; 438/967; 438/980
[58] Field of Search ..................... 438/488, 479, 438/149, 291, 292, 151, 967, 935, 507, 508, 509

[56] References Cited

U.S. PATENT DOCUMENTS

| | | |
|---|---|---|
| 5,011,759 | 4/1991 | Hitotsuyanagi et al. ............... 430/128 |
| 5,120,394 | 6/1992 | Mukai . |
| 5,194,398 | 3/1993 | Miyachi et al. . |
| 5,232,868 | 8/1993 | Hayashi et al. . |

FOREIGN PATENT DOCUMENTS 5-315269  11/1993  Japan .
7-211653  8/1995  Japan .

OTHER PUBLICATIONS

Shiota et al.; "Growth of High Quality Poly–SiGe on Glass Substrates"; Mat. Res. Soc. Symp. Proc. vol. 452 (Advances in Microcrystalline and Nanocrystalline Semiconductors–1996); Symposium held Dec. 2–6, 1996, Boston MA; 1997, pp. 1001–1006, 1997.

Tsai et al.; "Effects of Ge on Material and Electrical Properties of Polycrystalline Si1–xGex for TFT Applications"; Proceedings of the Second Symposium on Thin Film Transistor Technologies; The Electrochemical Society Proceedings 94–35, Symposium held on, 1995.

Primary Examiner—Mary Wilczewski
Attorney, Agent, or Firm—Whitham, Curtis & Whitham

[57] ABSTRACT

Polycrystalline silicon-germanium alloy is grown on a glass substrate through a chemical vapor deposition under the conditions where the substrate temperature ranges from 350 degrees to 450 degrees in centigrade, the ratio between gas flow rate of $Si_2H_6$ and the gas flow rate of $GeF_4$ ranges from 20:0.9 to 40:0.9 and the dilution gas is selected from the group consisting of helium, argon, nitrogen and hydrogen, and the composition ratio of silicon of the polycrystalline silicon-germanium is equal to or greater than 80 percent so that the carrier mobility is drastically improved.

6 Claims, 6 Drawing Sheets

PROCESS OF GROWING POLYCRYSTALLINE SILICON-GERMANIUM ALLOY HAVING LARGE SILICON CONTENT

FIELD OF THE INVENTION

This invention relates to a process of growing silicon-germanium alloy and, more particularly, to a process of growing polycrystalline silicon-germanium alloy having a large silicon content.

DESCRIPTION OF THE RELATED ART

The silicon-germanium alloy finds a wide variety of application in the field of electronic devices such as, for example, a thin film transistor incorporated in a liquid crystal color display.

A typical example of the process of growing silicon-germanium alloy is disclosed in Japanese Patent Publication of Unexamined Application No. 5-315269. The prior art process proceeds as follows. A substrate is placed in a reaction chamber of a chemical vapor deposition system, and is heated to 200 degrees to 600 degrees in centigrade. Vacuum is developed in the reaction chamber to $10^{-6}$ torr or less and gaseous mixture of $GeF_4$ and silane, which is expressed as $Si_nH_{2n+2}$ where n is an integer between 1 and 3, is introduced into the reaction chamber. The gaseous mixture further contains dilution gas selected from the group consisting of hydrogen, nitrogen, helium and argon. Then, germanium or silicon-germanium alloy is deposited over the substrate. The substrate is formed of single crystalline silicon, single crystalline germanium, glass, polycrystalline silicon, amorphous silicon, polycrystalline germanium or amorphous germanium. When the substrate temperature is less than 200 degrees in centigrade, the germanium or silicon-germanium is hardly grown on the substrate, because the pyrolysis is too slow to use in an actual process. On the other hand, when the substrate temperature exceeds 600 degrees in centigrade, the material gas is decomposed, and the thin film is not uniform in quality.

Another prior art process is disclosed in Japanese Patent Publication of Unexamined Application No. 7-211653. The prior art process is similar to the prior art process disclosed in Japanese Patent Publication of Unexamined Application No. 5-315269. Differences are the growing material, the temperature range of pyrolysis and the ratio of flow rate between $GeF_4$ and silane. The prior art process disclosed in Japanese Patent Publication of Unexamined Application No. 7-211653 is used for growing germanium, and proposes the temperature range between 300 degrees to 500 degrees in centigrade and the ratio of flow rate between 0.006 to 0.2. The germanium is grown on a silicon dioxide layer, a phospho-silicate glass layer, a boro-silicate glass layer or a silicon nitride layer patterned on a single crystalline silicon substrate, a single crystalline germanium substrate. The Japanese Patent Publication of Unexamined Application teaches that the silicon oxide layer is patterned on a polycrystalline silicon substrate, an amorphous silicon substrate, a polycrystalline germanium substrate or an amorphous germanium substrate. The Japanese Patent Publication of Unexamined Application describes the reason whey the substrate temperature ranges between 300 degrees to 500 degrees in centigrade. If the substrate temperature is lower than 300 degrees in centigrade, the pyrolysis is to slow to grow the germanium on the substrate at a commercially available speed. On the other hand, if the substrate temperature exceeds 500 degrees in centigrade, the selectivity for the germanium layer requires a quite narrow ratio of flow rate, and the prior art process is hardly available for the chemical vapor deposition in a commercial plant.

The prior art process disclosed in Japanese Patent Publication of Unexamined Application No. 5-315269 is not available for growth of silicon-germanium alloy. Although silicon-germanium alloy is grown through the prior art process disclosed in Japanese Patent Publication of Unexamined Application No. 7-211653, the silicon-germanium alloy encounters problems in a small carrier mobility and a low breakdown voltage.

SUMMARY OF THE INVENTION

It is therefore an important object of the present invention to provide a process of growing polycrystalline silicon-germanium alloy which is large in field effect mobility and high in breakdown voltage.

The present inventors contemplated the problems, and noticed that the germanium content was as much as 90 percent or more. The germanium imparted the p-type conductivity to the silicon-germanium alloy, and the p-type carrier density was of the order of $10^{18}$ $cm^{-3}$. For this reason, when the silicon-germanium alloy was used in a thin film field effect transistor, the field effect mobility was lower than that in polycrystalline.

The low breakdown voltage was also derived from the large germanium content. Germanium is lower in breakdown voltage than silicon. The larger the germanium content, the lower the breakdown voltage. In fact, the silicon-germanium alloy grown through the prior art process was lower than that of polycrystalline.

To accomplish the object, the present invention proposes to increase silicon content of polycrystalline silicon-germanium alloy by controlling a substrate temperature between 350 degrees and 450 degrees in centigrade.

In accordance with one aspect of the present invention, there is provided a process of growing polycrystalline silicon-germanium alloy on a glass substrate, comprising the steps of preparing a glass substrate having a major surface where a deformation takes place over a certain temperature, heating the glass substrate to 350 degrees in centigrade and the certain temperature; and supplying gaseous mixture containing $Si_2H_6$, $GeF_4$ and dilution gas in a reaction zone on and over the major surface of the glass substrate so as to grow silicon-germanium alloy containing silicon equal to or greater than 80 percent by atom on the major surface, and the ratio between the gas flow rate of $Si_2H_6$ and the gas flow rate of $GeF_4$ ranges from 20:0.9 to 40:0.9.

In accordance with another aspect of the present invention, there is provided a process of fabricating a thin film transistor on a transparent glass substrate shared with pixels of a liquid crystal display, comprising the steps of preparing a glass substrate having a major surface where a deformation takes place over a certain temperature, heating the glass substrate to 350 degrees in centigrade and the certain temperature, supplying gaseous mixture containing $Si_2H_6$, $GeF_4$ and dilution gas in a reaction zone on and over the major surface of the glass substrate so as to a grow silicon-germanium alloy layer containing silicon equal to or greater than 80 percent by atom on the major surface, the ratio between the gas flow rate of $Si_2H_6$ and the gas flow rate of $GeF_4$ ranging from 20:0.9 to 40:0.9, selectively introducing a dopant impurity into a source region and a drain region in the silicon-germanium alloy layer so as to form a source region and a drain region, and completing a thin film field effect transistor.

BRIEF DESCRIPTION OF THE DRAWINGS

The features and advantages of the process of growing silicon-germanium alloy will be more clearly understood from the following description taken in conjunction with the accompanying drawings in which.

DEPOSITING CONDITIONS FOR LARGE SILICON CONTENT

Figure 1:
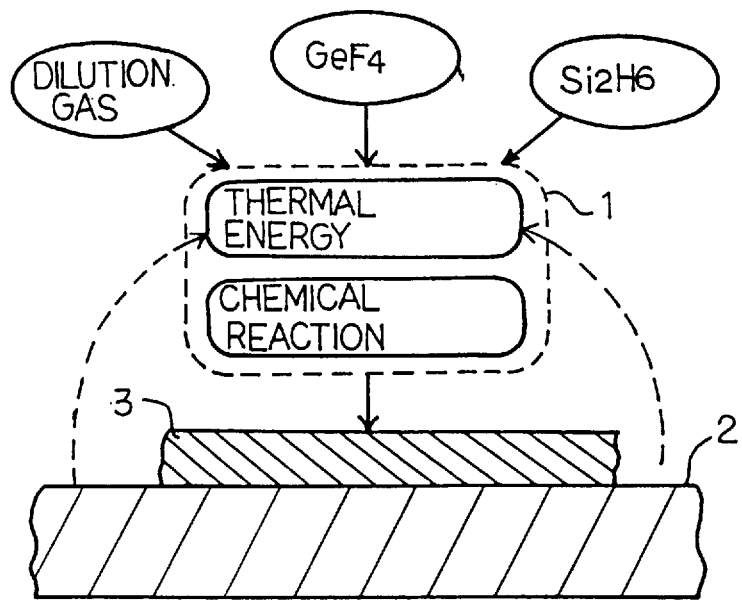
FIG. 1 is a view showing a reaction system for depositing silicon-germanium alloy according to the present invention.

FIG. 1 illustrates the concept of the chemical vapor deposition according to the present invention. Reactant gases $GeF_4$ and $Si_2H_6$ are supplied to a reacting zone 1 on and in the vicinity of the major surface of a substrate 2 together with dilution gas such as hydrogen. The substrate 1 is heated, and $Si_2H_6$ reacts with $GeF_4$ by the aid of thermal energy. $GeF_4$ promotes the decomposition of $Si_2H_6$, and improves the crystallinity. For this reason, polycrystalline silicon-germanium 3 is grown at lower temperature and lower pressure than the pyrolysis of $Si_2H_6$ in the absence of $GeF_4$. Thus, not only the thermal energy but also the chemical reaction are used in the deposition according to the present invention.

Substrate Temperature

Figure 2:
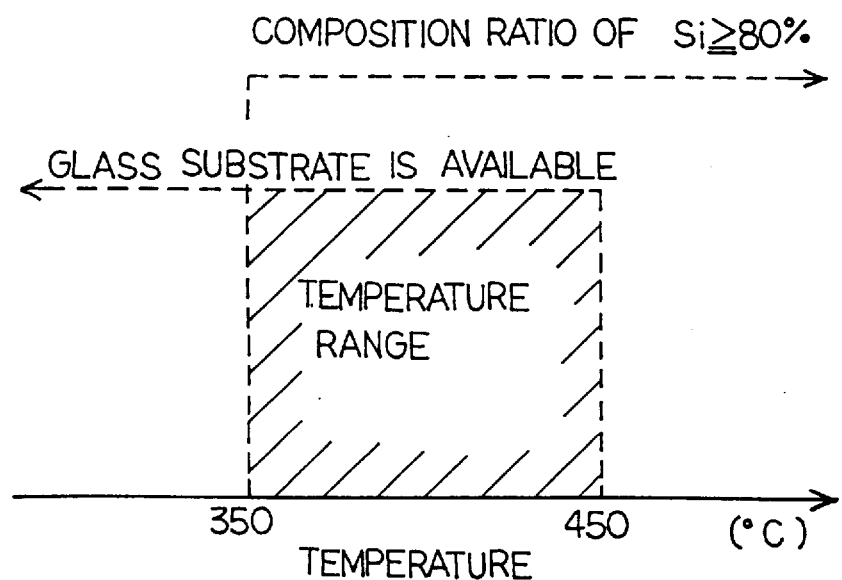
FIG. 2 is a graph showing a temperature range available for the deposition of the silicon-germanium alloy.

FIG. 2 illustrates the range of the substrate temperature for the chemical vapor deposition according to the present invention. The substrate temperature range was experimentally determined in view of silicon content equal to or greater than 80 percent by atom and the availability of a glass substrate.

Figure 3:
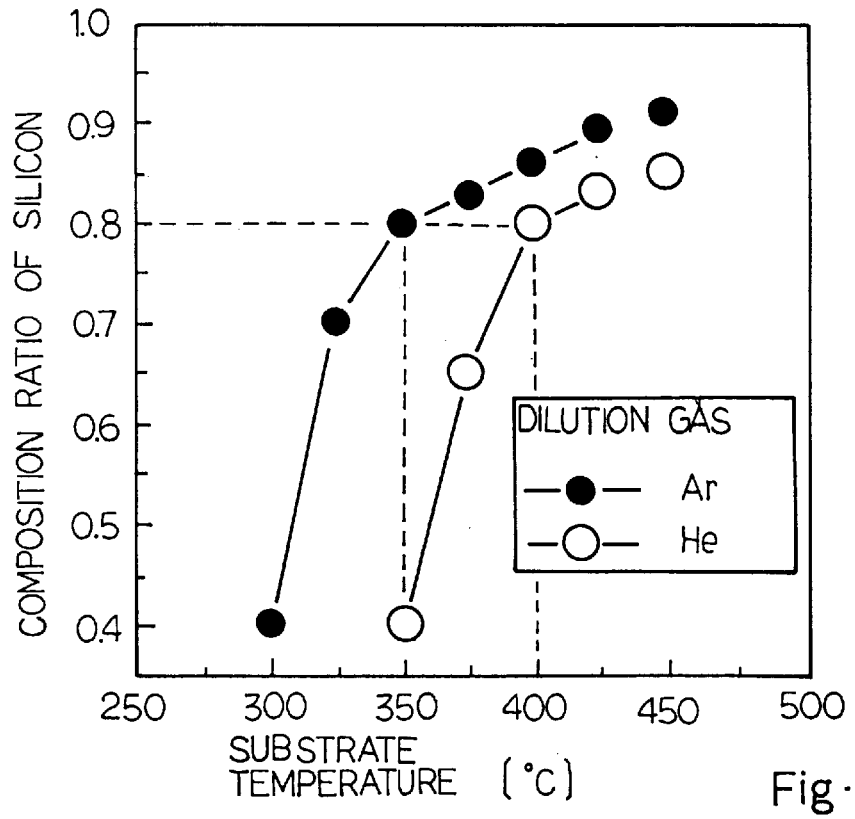
FIG. 3 is a graph showing relation between the composition ratio of silicon and substrate temperature.

Not only the substrate temperature but also the dilution gas and the flow rate of $Si_2H_6$ had influences on the composition ratio of silicon. The present inventors grew silicon germanium alloy on substrates at different substrate temperature. $Si_2H_6$ and $GeF_4$ were respectively regulated to 20 sccm and 0.9 sccm, and the dilution gas was changed between helium and argon. After the deposition of the silicon germanium alloy, the silicon content or the composition ratio of silicon was investigated, and the composition ratio of silicon was plotted in FIG. 3. When argon gas was used as the dilution gas, the substrate temperature at 350 degrees in centigrade resulted in the composition ratio of silicon at 80 percent. On the other hand, when helium was mixed into the reactant gases, the composition ratio of silicon at 80 percent was achieved at the substrate temperature at 400 degrees in centigrade. However, when the substrate temperature was lower than these critical values, the composition ratio of silicon was less than 80 percent. The present inventors confirmed that flow rate of $Si_2H_6$ more than 20 sccm could not increase the composition ratio of silicon to 80 percent or more under the critical temperatures, i.e. 350 degrees in centigrade for argon gas and 400 degrees for helium.

The reason why Ar achieved the large composition ratio of silicon at the lower critical temperature than He was that Ar promoted the chemical reaction in the reaction zone 1 by virtue of the thermal diffusion coefficient larger than that of He.

The present inventors grew silicon-germanium alloy on glass substrates. The glass substrate contained $SiO_2$ ranging between 50 percent and 60 percent by volume, $Al_2O_3$ ranging between 15 percent and 16 percent by volume, $B_2O_3$ ranging between 5 percent and 10 percent by volume, BaO ranging between 10 percent and 15 percent by volume and CaO+ZnO ranging between 5 percent and 15 percent by volume. The chemical vapor deposition was carried out at different substrate temperatures, and investigated the crystallinity of the silicon-germanium alloy. The present inventors confirmed that the silicon germanium alloy deposited at 450 degrees in centigrade or less had good crystal structure available for a driving circuit for a liquid crystal display. The crystallinity was good at the boundary between the glass substrate and the silicon-germanium alloy. However, when the substrate temperature exceeded 450 degrees in centigrade, the glass substrate was warped, and patterns for the driving circuit were hardly transferred to the silicon-germanium alloy on the glass substrate by using lithographic techniques.

The temperature range according to the present invention was the intersection between the temperature range equal to or greater than 350 degrees in centigrade and the temperature range equal to or less than 450 degrees in centigrade. Thus, the substrate temperature according to the present inven-ranged between 350 degrees and 450 degrees. The present inventors further confirmed that the critical substrate temperature for the nitrogen and hydrogen ranged between 350 degrees and 450 degrees in centigrade.

When hydrogen was used as the dilution gas, crystal defects at the grain boundaries were cured by the hydrogen. Thus, the hydrogen achieved a high quality polycrystalline silicon-germanium alloy layer.

Gas Flow Rate

Figure 4:
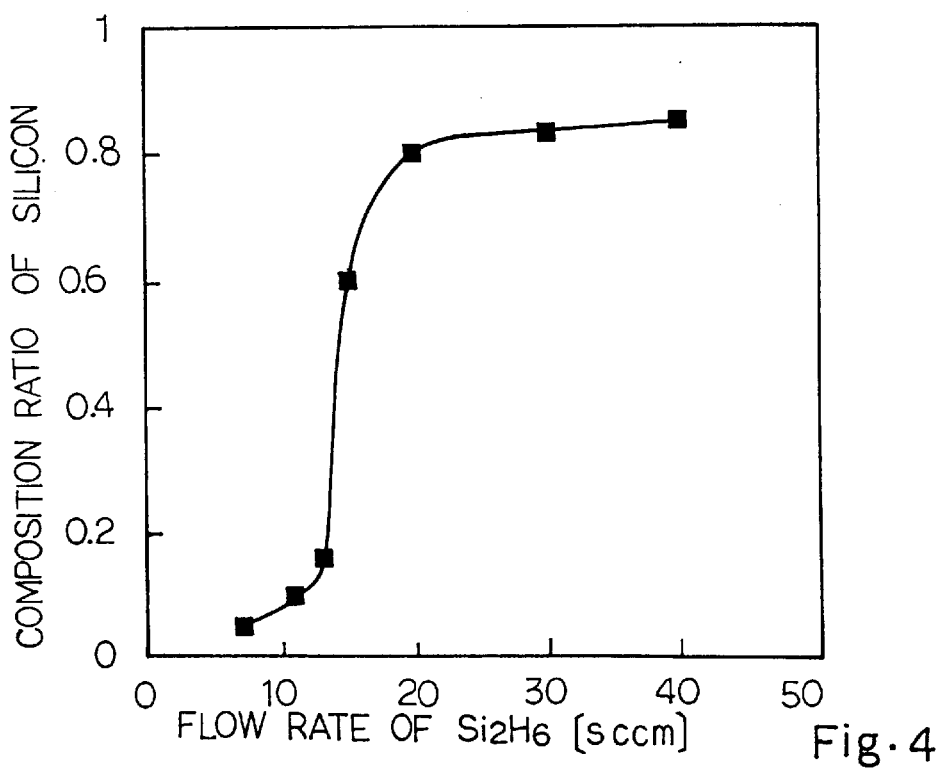
FIG. 4 is a graph showing relation between flow rate of $Si_2H_6$ and composition ratio of silicon.

Subsequently, the present inventors investigated relation between the flow rate of $Si_2H_6$ and the composition ratio of silicon in the polycrystalline silicon-germanium alloy. The present inventors regulated the substrate temperature to 400 degrees in centigrade, and grew polycrystalline silicon-germanium alloy at different flow rate of $Si_2H_6$. The flow rate of $GeF_4$ was fixed to 0.9 sccm. The composition ratio of silicon was plotted in FIG. 4. When the flow rate of $Si_2H_6$ ranged from 7 sccm to 13 sccm, the composition ratio of silicon was less than 20 percent. However, the composition ratio of silicon was drastically increased from the flow rate of $Si_2H_6$ 15 sccm. The composition ratio of silicon exceeded 80 percent under the flow rate more than 15 sccm. This implied that the chemical reaction was changed around 15 sccm. When the flow rate of $Si_2H_6$ ranged between 7 sccm and 13 sccm, the growth of the polycrystalline silicon-germanium alloy was dominated by the oxidation-reduction reaction. However, the polycrystalline silicon-germanium alloy was grown through the pyrolysis of $Si_2H_6$ in the range between 20 sccm and 40 sccm. The pyrolysis was promoted in the presence of $GeF_4$, and the crystallinity was improved on the substrate.

When the flow rate of $Si_2H_6$ was widely increased over 40 sccm, $GeF_4$ did not promote the pyrolysis of $Si_2H_6$, and the polycrystalline silicon-germanium alloy was deteriorated in crystallinity. For this reason, the present inventors determined the maximum flow rate of $Si_2H_6$ to be 40 sccm. On the other hand, when the flow rate of $Si_2H_6$ was less than 20 sccm, the variation of the composition ratio of silicon became large with respect to the flow rate of $Si_2H_6$, and the present inventors hardly controlled the composition ratio of silicon. For this reason, the present inventors determined the minimum flow rate of $Si_2H_6$ to be 20 sccm.

Though not shown in the drawings, the present inventors further carried out the chemical vapor deposition by changing the flow rate of $GeF_4$. The flow rate of $Si_2H_6$ was fixed to 20 sccm. The composition ratio of germanium exceeded 95 percent at the flow rate of Ge=2.7 sccm. The composition ratio of germanium was drastically changed around 1.5 sccm, and was of the order of 20 percent at the flow rate of Ge=0.9 sccm. For this reason, the present inventors determined the flow rate of $Si_2H_6$ to be between 20 sccm and 40 sccm in the presence of $GeF_4$ at 0.9 sccm.

Germanium is not the major factor of the polycrystalline structure, because a chemical vapor deposition using the reactant gases of $Si_2H_6$ and $GeH_4$ did not grow a polycrystalline structure under the substrate temperature at 500 degrees in centigrade.

Properties

Figure 5:
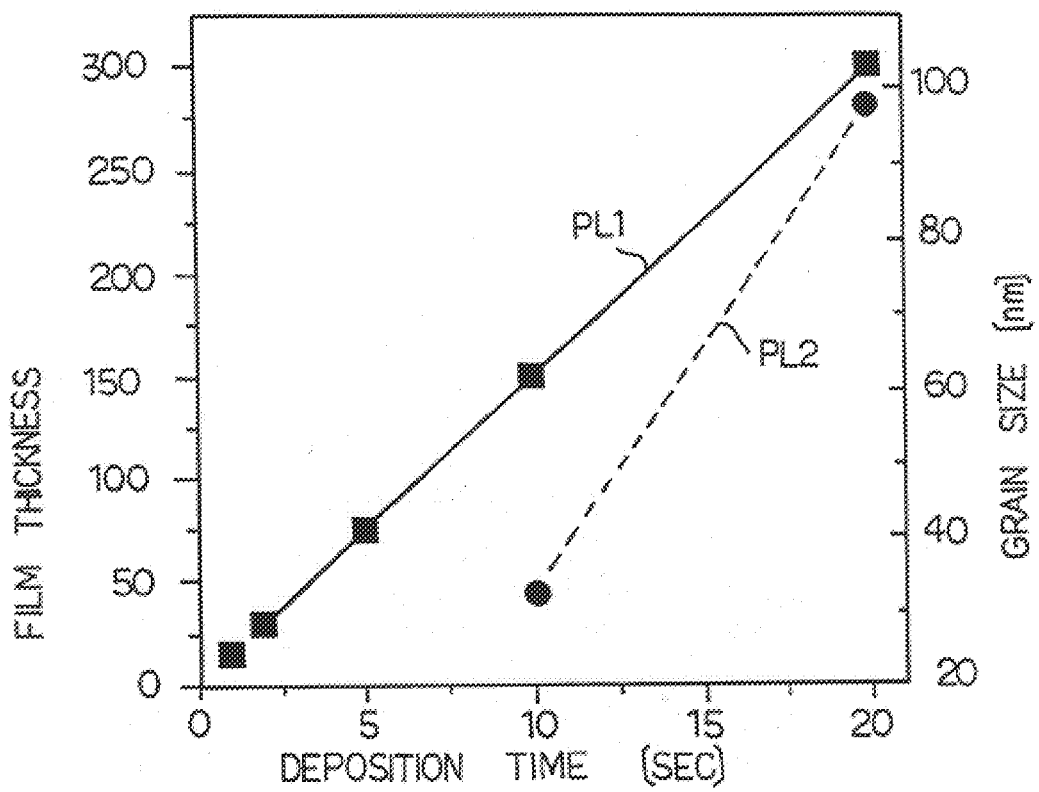
FIG. 5 is a graph showing a film thickness and a grain size of a silicon-germanium alloy layer in terms of time.
Figure 6:
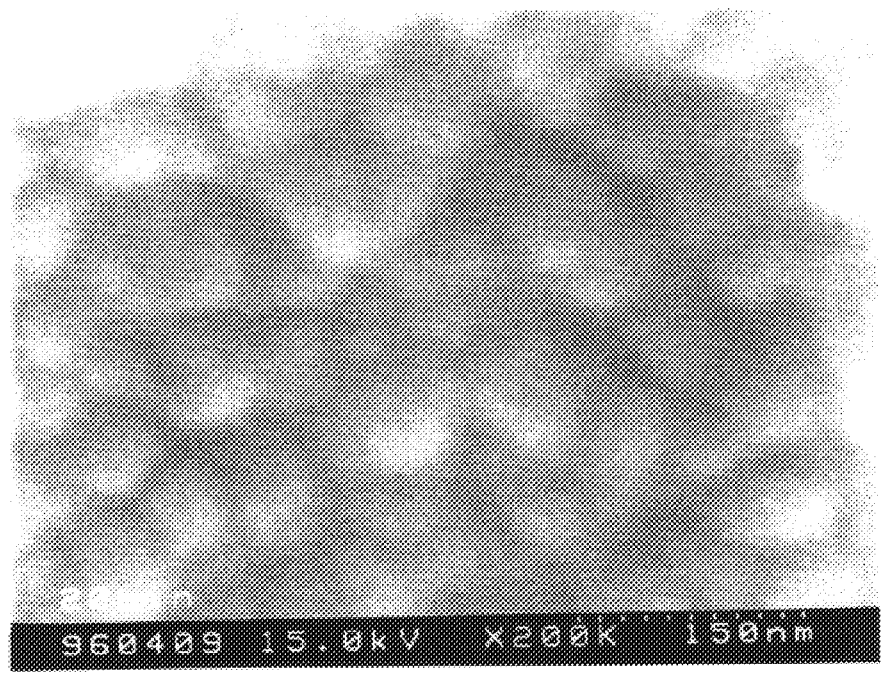
FIG. 6 is a photograph showing the grains of the silicon-germanium alloy layer.

The present inventors investigated qualities and properties of silicon-germanium alloy deposited through the chemical vapor deposition in the technical scope according to the present invention. The present inventors grew polycrystalline silicon-germanium alloy on a substrate, and measured the film thickness and the grain size in terms of the deposition time. The film thickness and the grain size were plotted in FIG. 5, and plots PL1 and PL2 indicted the film thickness and the grain size, respectively. The film thickness was increased with time, and the deposition rate was of the order of 0.15 nanometers/second. When the polycrystalline silicon-germanium alloy was deposited for 20 minutes, the present inventors stooped the chemical vapor deposition, and the surface of the polycrystalline silicon-germanium alloy layer was treated with "dash" etching solution, and took a picture (see FIG. 6) through a scanning electron microscopy at the magnitude of 200,000. The grain size was uniform, and average grain size was of the order of 100 nanometers.

The substrate temperature and the flow rate of the reactant gases dominated irregularity of film quality. The substrate temperature and the gas flow rate were regulable to target values, and the polycrystalline silicon-germanium alloy layer was grown on a wide area of the substrate without the irregularity.

Subsequently, the present inventors investigated electric properties of the polycrystalline silicon-germanium alloy by using a four-probe method called as van der Pauw method. The polycrystalline silicon-germanium had the electric conductivity close to an intrinsic semiconductor, and the carrier density was $5\times10^{15}$ cm$^{-3}$. The carrier mobility was investigated by using a hole measurement, and was equal to or greater than 10 cm$^2$/V·s. The carrier mobility was much larger than that of the silicon-germanium alloy with the large germanium content.

The present inventors fabricated thin film field effect transistors on a silicon-germanium alloy layer deposited through the chemical vapor deposition in the technical scope of the present invention, and confirmed that the transistor characteristics such as the field effect mobility, the breakdown voltage and temperature characteristics were as good as those of thin film field effect transistors fabricated on a polycrystalline silicon layer.

DESCRIPTION OF THE PREFERRED EMBODIMENT

Figure 7:
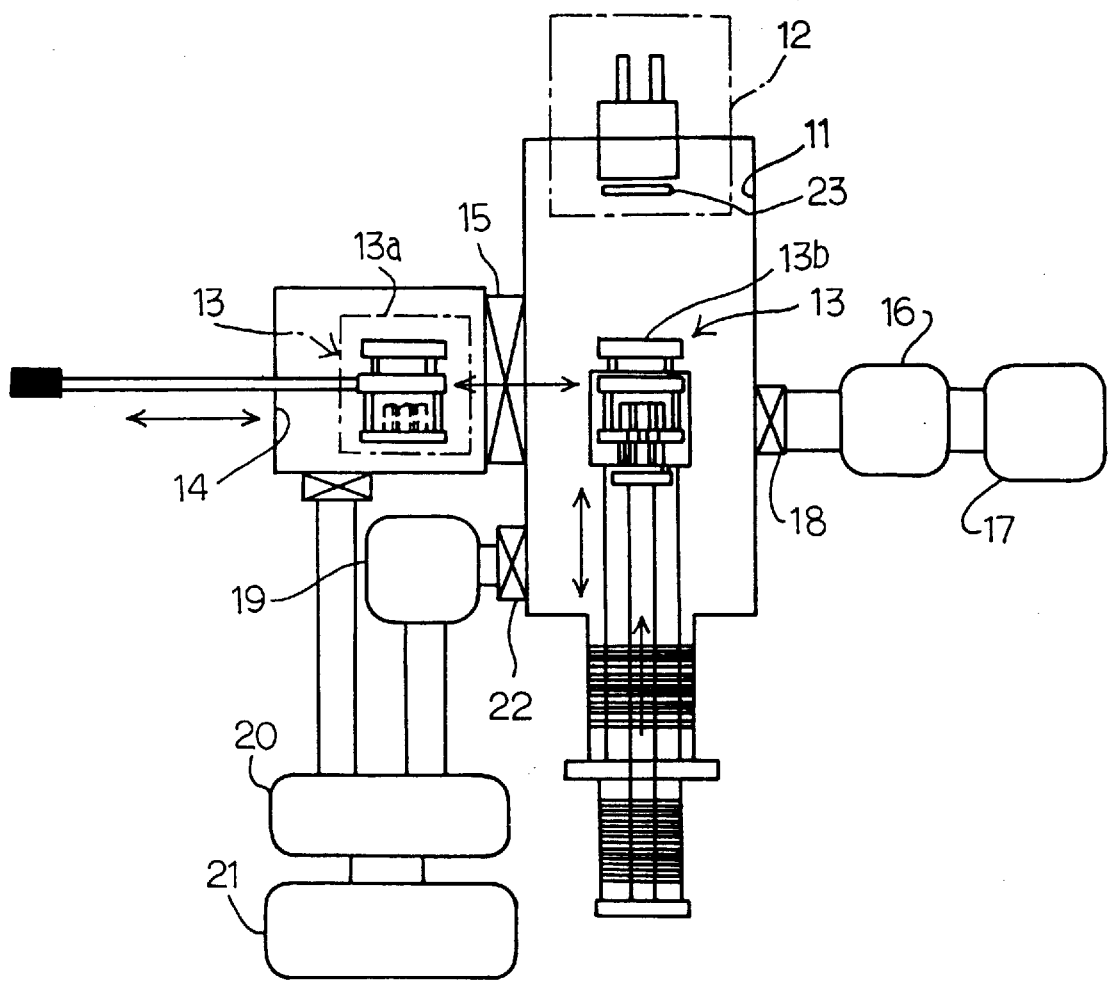
FIG. 7 is a schematic view showing a chemical vapor deposition system.

FIG. 7 illustrates a chemical vapor deposition system used for the chemical vapor deposition embodying the present invention. First, description is made on the chemical vapor deposition system.

The chemical vapor deposition system comprises a growing chamber 11 and a gas supply sub-system 12 exposed to the growing chamber 11. The gas supply sub-system 12 supplies the reactant gases, i.e., $Si_2H_6$, $GeF_4$ and the dilution gas selected from the group consisting of He, Ar, $N_2$ and $H_2$ to the growing chamber 11.

The chemical vapor deposition system further comprises a substrate holder 13, a preparatory room 14 and a gate valve 15 provided between the growing chamber 11 and the preparatory room 14. The gate valve 15 is movable between an open position and closed position. When the gate valve 15 is in the closed position, the gate valve 15 separates the growing room 11 from the preparatory room 14. On the other hand, when the gate valve 15 is changed to the open position, the preparatory room 14 is conducted to the growing room 11, and the substrate holder 13 is moved between a preparatory position 13a and a ready-for-deposition position 13b.

The chemical vapor deposition system further comprises a turbo molecular pump 16, a rotary pump 17 and a gate valve 18. The gate valve 18 is changed between the open position and the closed position as similar to the gate valve 15, and is provided between the growing chamber 11 and the turbo molecular pump 16. The turbo molecular pump 16 develops vacuum equal to or less than $10^{-6}$ torr in the growing chamber 11.

The chemical vapor deposition system further comprises an auto-pressure controller 19, a mechanical booster pump 20, a rotary pump 21 and a gate valve 22. The gate valve 22 is also changed between the open position and the closed position, and conducts the growing chamber 11 through the auto-pressure controller 19 to the pumps 20/21 during the chemical vapor deposition. The auto-pressure controller 19 cooperates with the pumps 20/21 so as to regulate the growing chamber 11 to a target vacuum level during the chemical vapor deposition.

Figure 8:
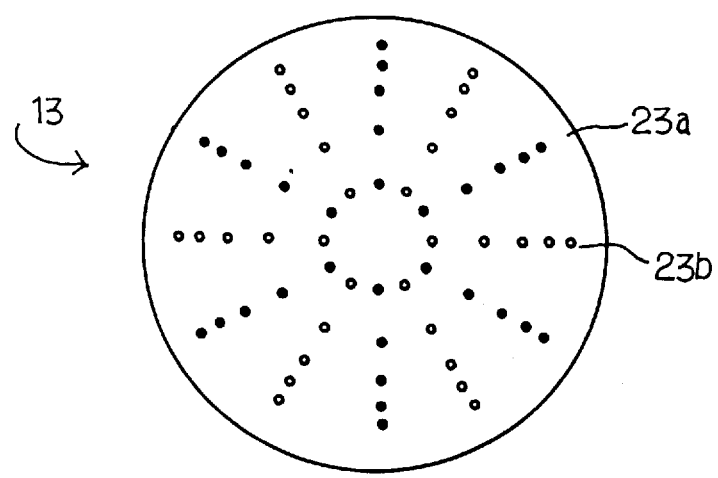
FIG. 8 is a plan view showing a shower head type gas supply nozzle incorporated in the chemical vapor deposition system.

A showerhead type gas supply nozzle 23 is connected to the gas supply sub-system 12, and the gaseous mixture is supplied through the showerhead type gas supply nozzle 23 to the growing chamber 11. As shown in FIG. 8, a plurality of nozzle holes 23a/23b are formed in the showerhead type gas supply nozzle 23, and are selectively connected to a source of $Si_2H_6$ and a source of $GeF_4$+dilution gas. In this instance, the nozzle holes 23a, which are represented by dots, are connected to the source of $Si_2H_6$, and the nozzle holes 23b, which are represented by bubbles, are connected to the source of $GeF_4$+dilution gas. The nozzle holes 23a are alternated with the nozzle holes 23b, and the nozzle holes 23a and 23b uniformly distribute the gaseous mixture into the reaction zone on and over a substrate on the substrate holder 13.

Polycrystalline silicon-germanium alloy is grown on the substrate as follows. First, the substrate is fixed to the substrate holder 13 in the preparatory room 14 separated from the growing room 11 by means of the gate valve 15. The gate valve 15 is changed to the open position, and the substrate holder 13 and, accordingly, the substrate are moved into the growing room 11. The substrate holder 13 is adjusted to a suitable position in the growing room 11.

The gate valve 15 is changed to the closed position, and the growing room 11 is isolated from the preparatory room 14. The gate valve 18 is changed to the open position, and the turbo molecular pump 16 and the rotary pump 17 are connected to the growing chamber 11. The turbo molecular pump 16 and the rotary pump 17 develop vacuum in the growing chamber 11, and a heater (not shown) of the substrate holder 13 heats the substrate during the development of vacuum. When the surface of the substrate reaches 450 degrees in centigrade, the heater maintains the surface of the substrate at 450 degrees. When the vacuum in the growing room 11 reaches $2 \times 10^{-6}$ torr, the turbo molecular pump 16 and the rotary pump 17 are stopped, and the gate valve 18 is changed to the closed position.

Subsequently, the gas supply sub-system 12 supplies the dilution gas such as He to the growing chamber 1 at 300 sccm, and the gate valve 22 is changed to the open position. The auto-pressure controller 19, the mechanical booster pump 20 and the rotary pump 21 regulate the pressure in the growing chamber 11 to 0.45 torr.

When the pressure in the growing chamber 11 and the substrate temperature become stable, $Si_2H_6$ and $GeF_4$ are supplied through the shower head type gas supply nozzle 23 into the growing chamber 11 at 20 sccm and 0.9 sccm. $Si_2H_6$ and $GeF_4$ spurt from the nozzle holes 23a/23b, and are immediately mixed with each other. The gaseous mixture of $Si_2H_6$, $GeF_4$ and He flows toward the substrate holder 13, and enters into the reacting zone 1 (see FIG. 1). Then, the gaseous mixture accepts thermal energy from the surface of the substrate, and starts the chemical reaction. The substrate temperature at 450 degrees in centigrade is much lower than the growing temperature of polycrystalline silicon at 600 degrees in centigrade. This is because of the fact that not only the thermal energy but also the chemical reaction are available for the decomposition and the recrystallization. Thus, the polycrystalline silicon-germanium alloy is deposited on the substrate of glass, which hardly withstands high temperature over 450 degrees in centigrade. The glass substrate is usually economical, and the manufacturer can fabricate thin film transistors on the economical glass substrate by using the polycrystalline silicon-germanium layer deposited through the chemical vapor deposition according to the present invention.

Figure 9:
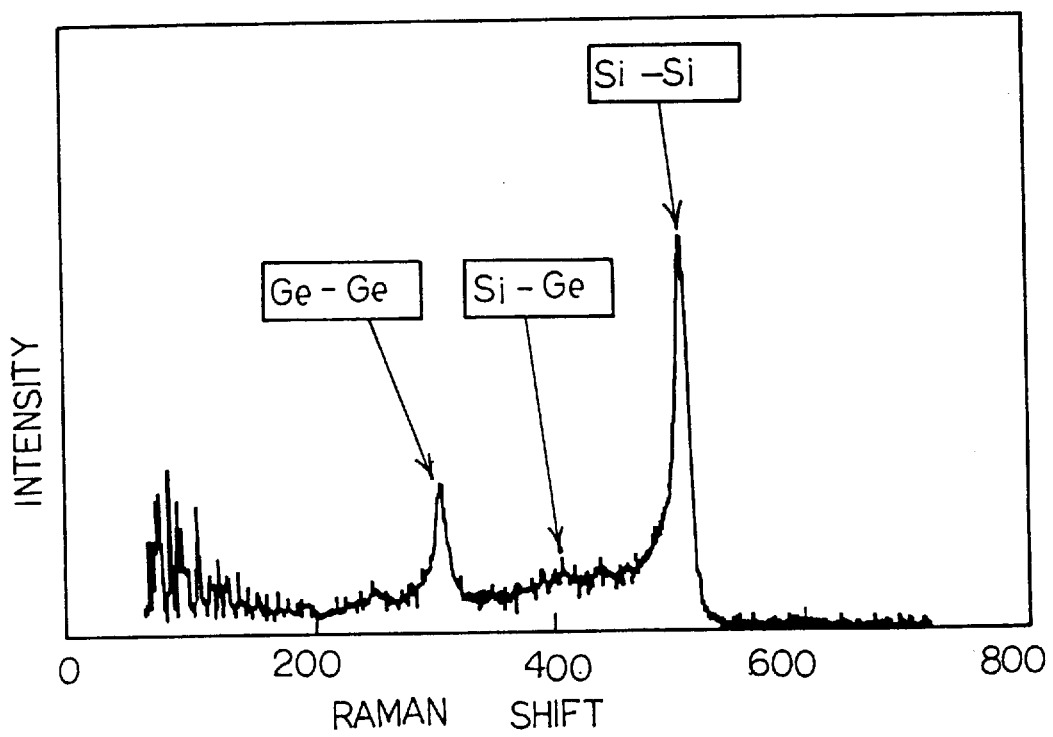
FIG. 9 is a graph showing a distribution of intensity obtained through a Raman spectral analysis.

The present inventors analyzed the polycrystalline silicon-germanium alloy by using a Raman spectral analyzer, and the result was shown in FIG. 9. The Raman spectral analysis indicated that the polycrystalline silicon-germanium alloy contained a large amount of silicon.

The polycrystalline silicon-germanium alloy layer is available for an electric circuit used in a liquid crystal display. The liquid crystal display has a pair of glass substrates, and liquid crystal fills the gap between the glass substrates. A matrix of pixel electrodes are formed in a certain image forming area on the glass substrate, and thin film switching transistors are fabricated in association with the pixel electrodes. The thin film switching transistors selectively connect image signal lines to the pixel electrodes, and a driver circuit supplies image-carrying signals through the image signal lines to the pixels.

Figure 10:
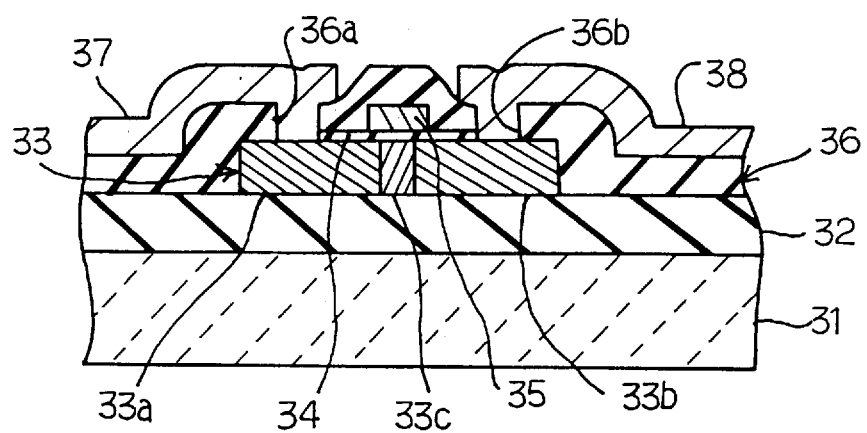
FIG. 10 is a cross sectional view showing the structure of a thin film transistor fabricated on a polycrystalline silicon-germanium alloy layer according to the present invention.

FIG. 10 illustrates a thin film field effect transistor forming a part of the driver circuit fabricated in another area on the glass substrate, and the polycrystalline silicon-germanium alloy layer allows the manufacturer to integrate the driver circuit with the pixels. A glass substrate 31 is shared between the pixels and the driver circuit, and the major surface of the glass substrate 31 is covered with a silicon oxide layer 32.

A polycrystalline silicon-germanium alloy layer is deposited on the silicon oxide layer 32 by using the chemical vapor deposition according to the present invention. The glass substrate 31 is heated to 350 degrees to 450 degrees in centigrade, and $Si_2H_6$ and $GeF_4$ are supplied at 20:0.9 to 40:0.9 so as to deposit the polycrystalline silicon-germanium alloy with the composition ratio of silicon equal to or greater than 80 percent. The polycrystalline silicon-germanium alloy layer is patterned into a polycrystalline silicon-germanium alloy strip 33.

A source region 33a and a drain region 33b are formed in the polycrystalline silicon-germanium alloy strip 33 by ion-implanting dopant impurity, and are spaced from each other by a channel region 33c. A gate insulating layer 34 of silicon oxide or silicon nitride covers the channel region 33c, and a gate electrode 35 is formed on the gate insulating layer 34.

An inter-level insulating layer 36 of silicon oxide is deposited over the entire surface of the resultant structure, and the source/drain regions 33a/33b and the gate electrode 35 are covered with the inter-level insulating layer 36. Contact holes 36a/36b are formed in the inter-level insulating layer 36, and the source/drain regions 33a/33b are exposed to the contact holes 36a/36b, respectively. A source electrode 37 and a drain electrode 38 are held in contact with the source region 33a and the drain region 33b through the contact holes 36a/36b.

The thin film field effect transistor achieves a switching action faster than the prior art thin film field effect transistor fabricated on the silicon-germanium alloy with large germanium content.

Although particular embodiments of the present invention have been shown and described, it will be obvious to those skilled in the art that various changes and modifications may be made without departing from the spirit and scope of the present invention.

What is claimed is:

1. A process of growing polycrystalline silicon-germanium alloy on a glass substrate, comprising the steps of:
   a) preparing a glass substrate having a major surface wherein a deformation takes place over a deformation temperature;
   b) heating said glass substrate between 350 degrees in centigrade and said deformation temperature; and
   c) supplying gaseous mixture containing $Si_2H_6$, $GeF_4$ and dilution gas in a reaction zone on and over said major surface of said glass substrate so as to grow silicon-germanium alloy containing silicon equal to or greater than 80 percent by atom on said major surface, the ratio between the gas flow rate of $Si_2H_6$ and the gas flow rate of $GeF_4$ ranging from 20:0.9 to 40:0.9.

2. The process as set forth in claim 1, in which said deformation temperature is 450 degrees in centigrade.

3. The process as set forth in claim 1, in which said dilution gas is selected from the group consisting of helium, argon, nitrogen and hydrogen.

4. The process as set forth in claim 3, in which said dilution gas is argon, and said glass substrate is heated to at least 350 degrees in centigrade in said step b).

5. The process as set forth in claim 3, in which said dilution gas is helium, and said glass substrate is heated to at least 400 degrees in centigrade in said step b).

6. A process of fabricating a thin film transistor on a transparent glass substrate shared with pixels of a liquid crystal display, comprising the steps of:
   a) preparing a glass substrate having a major surface where a deformation takes place over a deformation temperature;
   b) heating said glass substrate between 350 degrees in centigrade and said deformation temperature;
   c) supplying gaseous mixture containing $Si_4H_6$, $GeF_4$ and dilution gas in a reaction zone on and over said major surface of said glass substrate so as to grow silicon-germanium alloy layer containing silicon equal to or greater than 80 percent by atom on said major surface, the ratio between the gas flow rate of $Si_2H_6$ and the glass flow rate of $GeF_4$ ranging from 20:0.9 to 40:0.9;
   d) selectively introducing a dopant impurity into a source region and a drain region in said silicon-germanium alloy layer so as to form a source region and a drain region; and
   e) completing a thin film field effect transistor.

* * * * *